(12) United States Patent
Groe

(10) Patent No.: US 7,054,605 B1
(45) Date of Patent: May 30, 2006

(54) VARIABLE-GAIN LOW NOISE AMPLIFIER TO REDUCE LINEARITY REQUIREMENTS ON A RADIO RECEIVER

(75) Inventor: John B. Groe, Poway, CA (US)

(73) Assignee: Sequoia Communications Corporation, San Diego, CA (US)

( * ) Notice: Subject to any disclaimer, the term of this patent is extended or adjusted under 35 U.S.C. 154(b) by 453 days.

(21) Appl. No.: 10/051,762

(22) Filed: Jan. 16, 2002

Related U.S. Application Data

(60) Provisional application No. 60/261,962, filed on Jan. 16, 2001.

(51) Int. Cl.
*H04B 1/06* (2006.01)

(52) U.S. Cl. ............. 455/254; 455/232.1; 455/239.1; 455/234.1

(58) Field of Classification Search ............. 455/232.1, 455/234.1, 250.1, 245.1, 234.2, 303, 230.1, 455/226.1, 241.1, 254, 239.1, 240.1, 242.2, 455/249.1, 251.1, 245.2; 330/254, 278
See application file for complete search history.

(56) References Cited

U.S. PATENT DOCUMENTS

| | | | | |
|---|---|---|---|---|
| 5,732,342 A * | 3/1998 | Roth et al. ................ | 455/250.1 |
| 5,862,465 A * | 1/1999 | Ou ............................ | 455/251.1 |
| 6,002,925 A * | 12/1999 | Vu et al. .................. | 455/234.1 |
| 6,288,609 B1 * | 9/2001 | Brueske et al. .......... | 455/234.1 |
| 6,295,451 B1 * | 9/2001 | Mimura ..................... | 455/525 |
| 6,324,387 B1 * | 11/2001 | Kamgar et al. .......... | 455/234.1 |
| 6,373,907 B1 * | 4/2002 | Katsura et al. .......... | 455/234.2 |
| 6,442,380 B1 * | 8/2002 | Mohindra ................. | 455/250.1 |
| 6,480,066 B1 * | 11/2002 | Madni ....................... | 330/254 |
| 6,559,717 B1 * | 5/2003 | Lynn et al. ............... | 455/240.1 |
| 6,560,448 B1 * | 5/2003 | Baldwin et al. .......... | 455/234.1 |
| 6,571,083 B1 * | 5/2003 | Powell et al. ............ | 455/232.1 |
| 6,625,433 B1 * | 9/2003 | Poirier et al. ............ | 455/232.1 |
| 6,628,170 B1 * | 9/2003 | Titus .......................... | 330/278 |
| 6,763,228 B1 * | 7/2004 | Prentice et al. ........... | 455/234.1 |
| 2001/0053680 A1 * | 12/2001 | Yamanaka et al. ....... | 455/241.1 |

FOREIGN PATENT DOCUMENTS

| | | | |
|---|---|---|---|
| JP | 60-070807 | * | 4/1985 |
| JP | 04-053312 | * | 2/1992 |
| JP | 08-340226 | * | 12/1996 |

\* cited by examiner

*Primary Examiner*—Lana Le

(57) ABSTRACT

Variable gain low noise amplifier (LNA) system to reduce linearity requirements on a radio receiver. In the receiver, the LNA is coupled to receive an RF signal and produce an amplified signal at an LNA output. The receiver also comprises a VGA coupled to the LNA output to receive the amplified signal and produce a VGA output to downstream components of the receiver. The receiver also comprises a control network coupled to the LNA and the VGA. The control network operates to adjust gain factors of the continuously variable LNA and the VGA based on a received power indicator of the RF signal, so that a signal-to-noise ratio required for demodulation of the RF signal is met with a selected margin and the linearity requirements of the receiver are reduced.

7 Claims, 4 Drawing Sheets

VARIABLE-GAIN LOW NOISE AMPLIFIER TO REDUCE LINEARITY REQUIREMENTS ON A RADIO RECEIVER

CROSS REFERENCE TO RELATED APPLICATIONS

This application claims the benefit of priority from a co-pending U.S. Provisional Application entitled, "VARIABLE GAIN LOW NOISE AMPLIFIER to REDUCE LINEARITY REQUIREMENTS ON A RADIO RECEIVER" filed on Jan. 16, 2001, and having application No. 60/261,962.

FIELD OF THE INVENTION

This invention relates generally to radio receiver circuitry, and more particularly, to radio receiver system including a variable-gain low noise amplifier controlled in a manner to reduce the linearity requirements of the system.

BACKGROUND OF THE INVENTION

A critical building block in a radio receiver is the low noise amplifier (LNA). The LNA amplifies the received signal and boosts its power above the noise level produced by subsequent circuits. As such, the performance of the LNA greatly affects the sensitivity of the radio receiver.

FIG. 1 shows a diagram of a typical radio receiver 100. The radio receiver 100 includes a LNA 102 that receives radio frequency (RF) signals from an antenna 104 and amplifiers the RF signals for use by subsequent radio circuits. For example, the radio receiver 100 also includes a band pass filter (BPF) 106, a variable gain amplifier (VGA) 108, and a low pass filter (LPF) 110, which are used to demodulate the received signal.

The sensitivity of the radio receiver is a measure of the minimum signal that can be detected and demodulated. The minimum detectable signal (MDS) can be found using the expression $$MDS = kTF_T B$$

where kT is thermal noise floor, $F_T$ is the noise factor of the radio receiver, and B is the bandwidth of the system. It follows then that the sensitivity of the radio receiver is the minimum detectable signal adjusted by the signal-to-noise ratio (SNR) required for proper demodulation, i.e., $$\text{Sensitivity} = kTF_T(SNR)_{min}$$

The noise factor $F_T$ of a cascaded radio receiver is described by the well known Friis' equation as $$F_T = F_1 + \frac{F_2 - 1}{G_i} + \ldots \frac{F_2 - 1}{\prod_{i=1}^{n-1} G_i}$$

where $F_i$ is the noise factor and $G_i$ is the power gain of the $i^{th}$ stage. Note that the gain of the first few stages reduces the noise contributed by later stages. As a result, the first stage or first few stages set the noise factor of the radio receiver system.

The selectivity, or linearity, of the radio receiver is another important characteristic, and is a measure of the largest interfering signal that can be rejected by the system. Interfering signals can interact and produce intermodulation distortion products that degrade the quality (signal-to-distortion ratio) of the signal. The intermodulation distortion power increases rapidly with the interfering signal power. As a result, the later stages in a cascaded system have a profound effect on the overall linearity. This is because the gain of the earlier stages increases the amplitude of the signals applied to the later stages.

The sensitivity (cascaded noise factor) and selectivity (overall linearity) of the radio receiver create conflicting requirements. It is therefore advantageous to adapt the radio receiver to the operating environment.

In practice, the radio is switched between two operating modes—the first mode sets the LNA to its high gain value to receive low power radio signals, while the second mode by-passes the LNA to handle strong interfering signals. The LNA is switched from high gain mode to bypass mode when the received signal power is significantly above the minimum detectable signal level. Typically, this level is slightly larger than the gain difference between the two settings of the LNA.

FIG. 2 shows a graph 200 that illustrates the process of switching the LNA of the conventional radio receiver between the two operating modes. When the received signal power is low, the LNA is switched to its high gain value at shown at 202. When the received power is high, the LNA is switched to its low gain value as shown at 204.

Unfortunately, the switching approach described above places great stress on the linearity of the radio system just prior to switching the gain of the LNA, and amplifies the received signal power high above the receiver's noise floor—much more than required. Therefore, what is needed is a radio receiver that solves the above-described problems while providing excellent sensitivity and linearity.

SUMMARY OF INVENTION

The present invention includes a radio receiver system that analyzes the automatic gain control signal to lower the gain of the LNA while maintaining at least the minimum required signal quality (SNR). The automatic gain control (AGC) signal specifies the total gain of the radio receiver system and thus indicates the power level of the desired received signal. The desired received signal is the signal that is transmitted to, and intended to be received, by the receiver. Thus, even though the receiver may also receive interfering signals with the desired received signal, the receiver system included in the present invention operates to adjust the receiver based on the power level of the desired received signal. Therefore, the AGC signal is used to direct a control network to optimally adjust the LNA and subsequent variable gain amplifier (VGA) stages to deliver the required gain and performance.

In one embodiment included in the present invention a radio receiver is provided that includes at least one amplifier to receive incoming radio signals. The radio receiver also includes a control circuit coupled to the at least one amplifier, wherein the control circuit receives a quality indicator and adjusts the gain of the at least one amplifier based on the quality indicator.

In another embodiment included in the present invention a receiver is provided for receiving and demodulating an RF signal. The receiver comprises an LNA having continuously variable gain coupled to receive the RF signal and produce an amplified signal at an LNA output. The LNA includes an LNA control input to receive an LNA control signal that adjusts a gain factor of the LNA. The receiver also comprises a VGA coupled to the LNA output to receive the amplified signal, the VGA includes a VGA output that outputs a VGA output signal to downstream components of the receiver, and wherein the VGA includes a VGA control input to receive a VGA control signal that adjusts a gain factor of the VGA. The receiver also comprises a control network coupled to the LNA control input and the VGA control input, and wherein the control network operates to adjust the LNA and VGA gain factors based on a received power indicator of the RF signal.

In another embodiment included in the present invention, a method is provided for operating a receiver to receive an RF signal for demodulation. The receiver comprises an LNA with continuously variable gain that receives the RF signal and produces an LNA output signal coupled to a VGA. The LNA and VGA have control inputs to receive control signals that set gain factors of the LNA and VGA, respectively. The method comprises the steps of determining that a received power level of the RF signal is varying within a first selected power range, maintaining the gain factor of the VGA, and adjusting the gain factor of the LNA so that a signal-to-noise ratio required for demodulation of the RF signal is met with a selected margin and the linearity requirements of the receiver are reduced.

In another embodiment included in the present invention, a radio receiver is provided that comprises a continuously variable gain low noise amplifier (LNA) coupled to a subsequent variable gain amplifier (VGA), a demodulator to generate an automatic gain control signal indicating a power of level of a desired received signal, and a control network coupled to receive the gain control signal to optimally set the gain of the LNA and VGA.

BRIEF DESCRIPTION OF THE DRAWINGS

The foregoing aspects and the attendant advantages of this invention will become more readily apparent by reference to the following detailed description when taken in conjunction with the accompanying drawings wherein.

DETAILED DESCRIPTION

The present invention includes a system having an LNA with continuously variable gain. The gain of the LNA is varied with the power level of the desired received signal such that the signal to noise ratio required for demodulation is met with some margin and the linearity requirements of the radio receiver are eased. Thus, various embodiments of the present invention are described in detail in the following text.

The power level of the desired received signal input to the LNA can be measured in a variety of ways. In most radio receivers, a received signal strength indicator (RSSI) signal is available. It measures the total signal power after filtering and includes amplified noise, attenuated interfering signals, and intermodulation distortion products. Another method to determine the received signal power is by estimates of the bit energy per spectral noise density ($E_b/N_o$). This is practical in digital communication systems and is a better indication of the signal's power relative to the radio system's noise floor. A third method to determine the desired received signal power is based on the number of bit errors in the decoding process. This is directly related to the bit energy per spectral noise density technique. Thus, there exist a number of known techniques to determine the signal power of a received signal, and any of these techniques may be suitable for use in accordance with the present invention.

Figure 1:
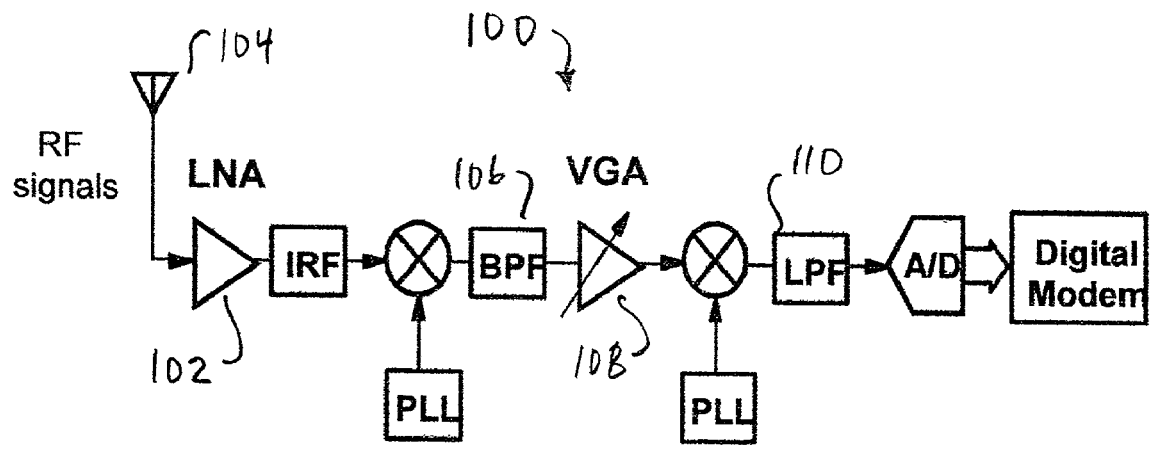
FIG. 1 shows a diagram of a typical radio receiver.
Figure 2:
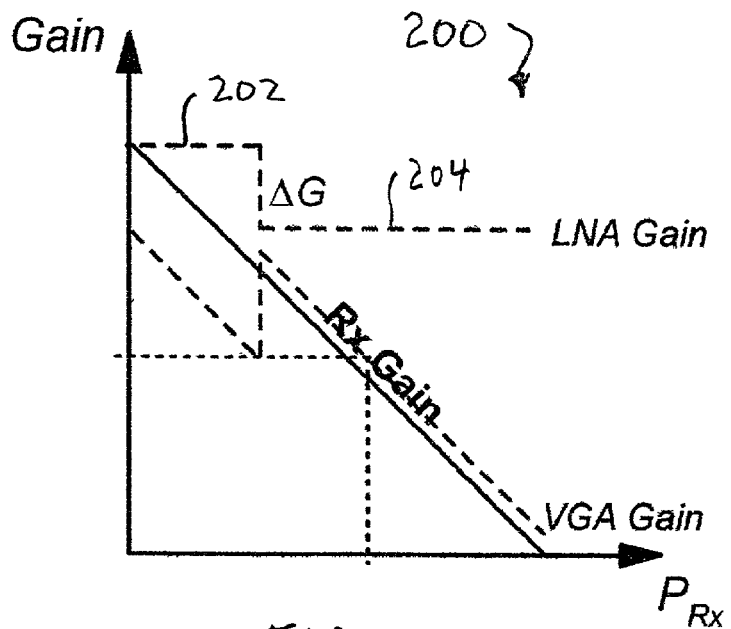
FIG. 2 shows a graph that illustrates the process of switching a LNA of the conventional radio receiver between the two operating modes.
Figure 3:
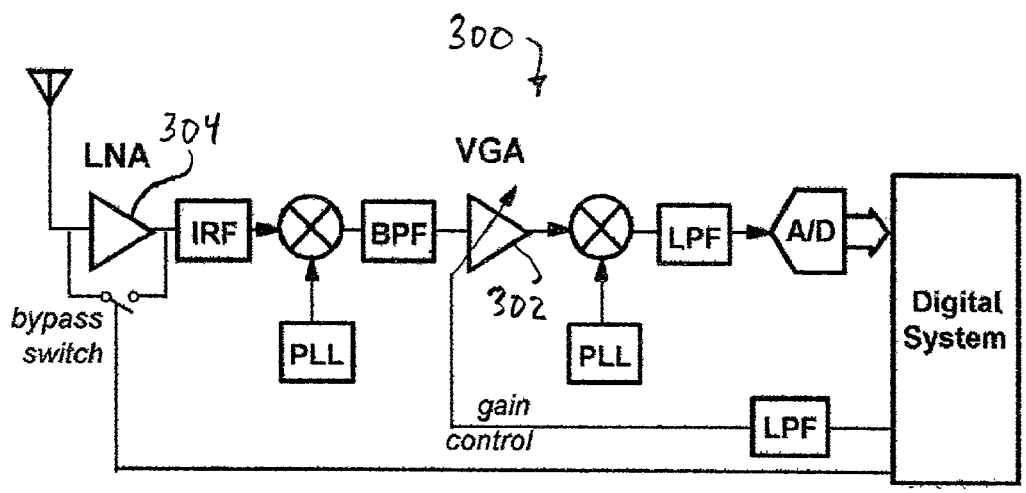
FIG. 3 shows a block diagram illustrating how the received signal power measurement is used to control the gain of a radio receiver.

FIG. 3 shows a diagram 300 illustrating how the desired received signal power measurement is used to control the gain of a conventional radio receiver. In a typical heterodyne radio receiver, the gain is controlled through an intermediate frequency (IF) variable gain amplifier (VGA) 302, while a front end LNA 304 is selectively bypassed using a switching circuit. However, this conventional radio receiver design is subject to the problems described above.

Figure 4:
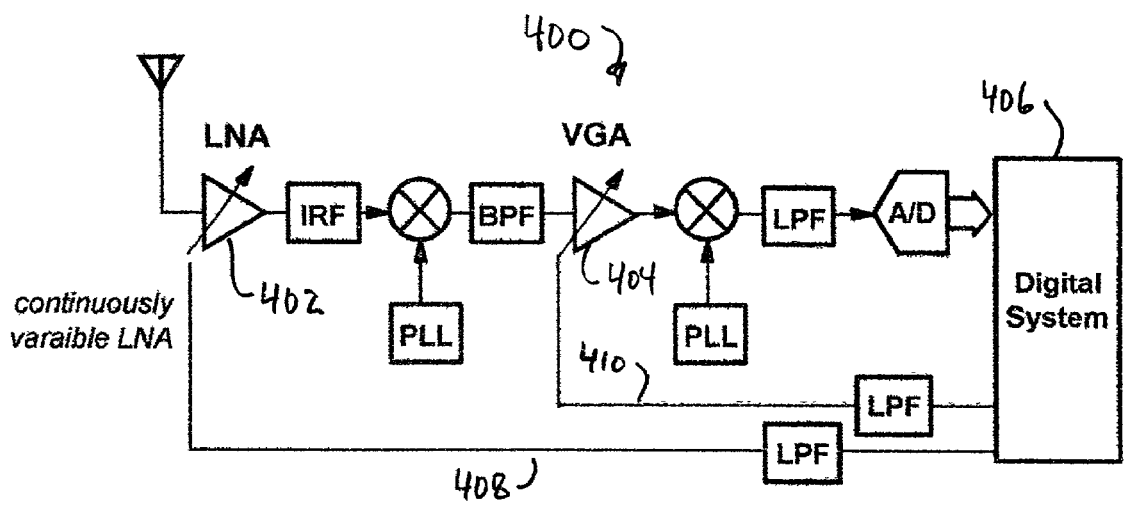
FIG. 4 shows a diagram of radio receiver system constructed in accordance with one embodiment of the present invention that operates to control the signal gain of a front-end variable-gain LNA and a subsequent VGA.

FIG. 4 shows a diagram of a circuit 400 constructed in accordance with one embodiment of the present invention that operates to control the signal gain of a front-end variable-gain LNA 402 and of a subsequent VGA 404. In the circuit of FIG. 4, the gain of the LNA 402 is continuously adjusted, either individually, or together with the gain of the VGA 404. Thus, the circuit of FIG. 4 operates to vary the gain of the LNA 402 with the power level of the desired received signal such that the signal-to-noise ratio required for demodulation is met with some margin and the linearity requirements of the radio receiver are eased. As described above, any suitable technique may be used to determine the received signal power. Digital system 406 outputs automatic gain control signals 408 and 410, respectively, to control the gain of the LNA 402 and the VGA 404.

Figure 5:
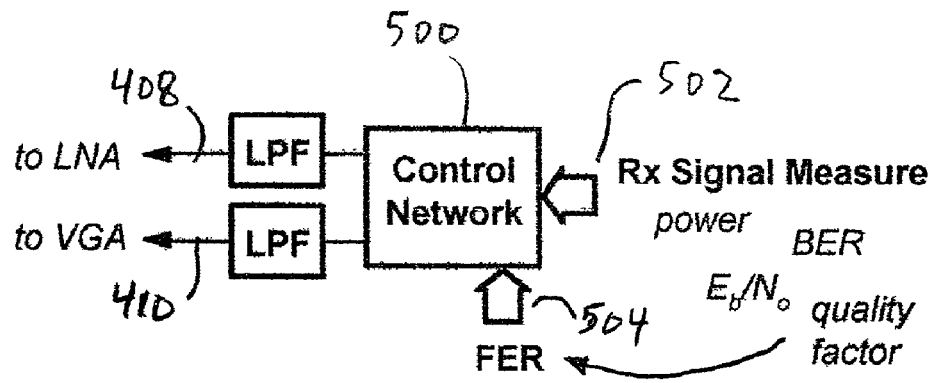
FIG. 5 shows a diagram of the control network used to control a variable gain LNA and subsequent VGA in accordance with the present invention.

FIG. 5 shows a diagram of a control network 500 used to control the variable-gain LNA 402 and the subsequent VGA 404 in accordance with the present invention. In one embodiment, the control network is incorporated into the digital system 406. The control network 500 uses a measurement of the desired received signal (502) to generate the LNA control signal 408 that sets the gain of the LNA 402, and the VGA control signal 40 that sets the gain of the VGA 404. The control network may also make use of a quality factor 504, such as the bit energy per spectral noise density ($E_b/N_o$), bit-error-rate (BER), or frame erasure rate (FER) of the detected signal to fine-tune the gain of the LNA and VGA. In one embodiment, the quality factor is generated by the digital system 406. The control network comprises any technology including digital logic, analog circuitry, and/or software to generate the control signals applied to the variable-gain LNA and VGA in accordance with the present invention.

Figure 6A:
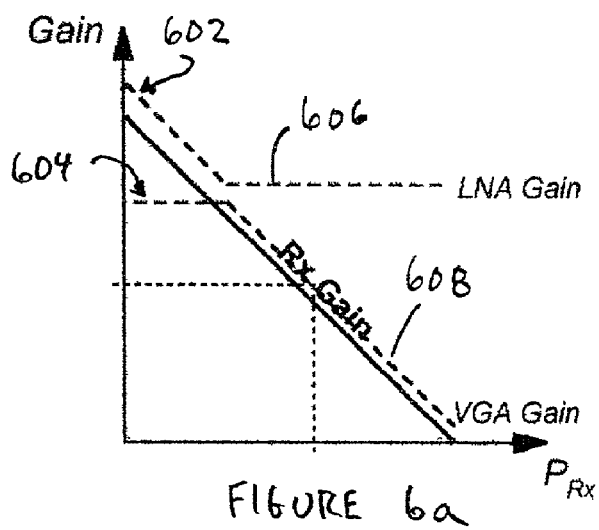
FIGS. 6a–b show graphs that illustrate how the gain of the LNA and the VGA are adjusted in accordance with the present invention based on changes to the power level of the desired received signal.
Figure 6B:
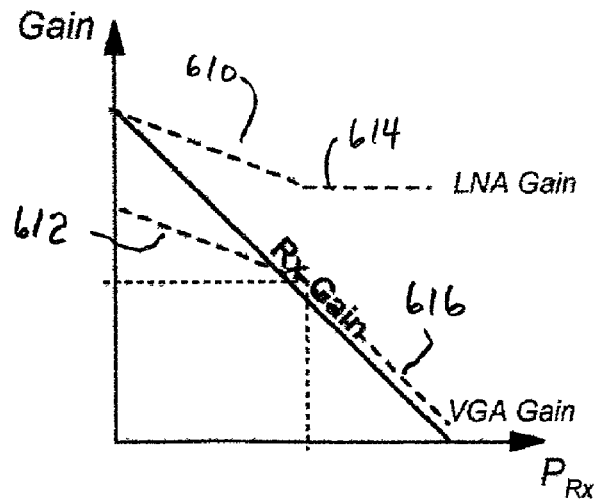

FIGS. 6a–b show graphs that illustrate how the gain of the LNA and the VGA are adjusted in accordance with the present invention based on changes to desired received signal power. In one embodiment, illustrated in FIG. 6a, when the power of the received signal ($P_{RX}$) is minimum, the gain of the LNA 402 is set to maximum 602 and the gain of the subsequent VGA 404 is set (604) to properly drive the A/D converter 406. As the power of the desired received signal increases, the gain of the LNA 402 is reduced until the it reaches a minimum 606, after which, the gain of the subsequent VGA 404 is reduced, as shown at 608. Thus, the LNA and VGA are adjusted independently to achieve the desired performance.

In another embodiment, illustrated in FIG. 6b, as the power of the desired received signal rises above the radio receiver's sensitivity level, the gain of the LNA 402 and the subsequent VGA 404 are adjusted together, as shown at 610 and 612, respectively. This continues until the gain of the LNA is minimum 614, then only the gain of the VGA is reduced, as shown at 616. Thus, the LNA and the VGA are adjusted together to achieve the desired performance.

It is preferable in the operation of the system that the LNA control is continuous, and for certain systems that rely heavily on power control such as CDMA IS95 and WCDMA, predictable. A simple calibration process ensures this second requirement.

Figure 7:
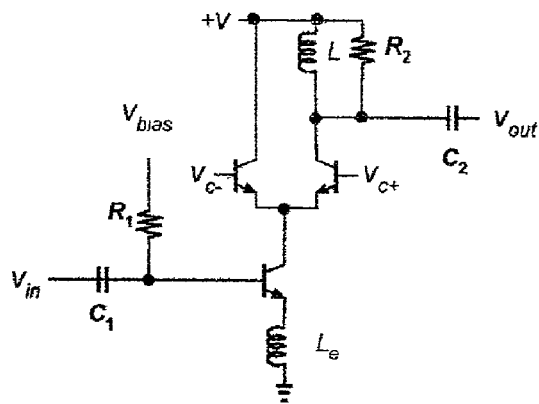
FIGS. 7–9 show several variable-gain LNA topologies constructed in accordance with the present invention.
Figure 8:
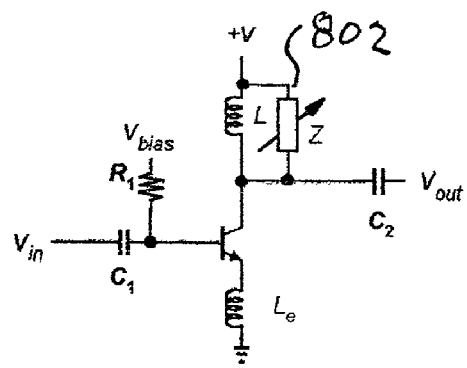
Figure 9:
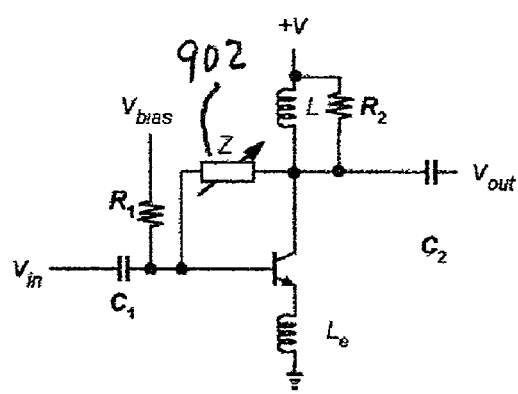

FIGS. 7–9 show several variable-gain LAN topologies constructed in accordance with the present invention. FIG. 7 shows a continuously variable-gain LAN based on a current-steering technique. This circuit offers a fixed input linearity. FIG. 8 shows a variable-gain LNA wherein a varactor or pin diode 802 is used as the load of the LNA to provide an alternative means to vary gain. This approach also offers a fixed input linearity.

FIG. 9 uses shunt feedback 902 to alter the gain of the LNA and improve the input linearity and results in superior operation. It should be noted, however, that in some applications the input linearity is a secondary issue, with the primary issue being LNA gain control to ease the linearity burden on later stages. With regards to the operation of the variable shunt feedback LNA structure of FIG. 9, at a high gain setting the feedback impedance is very high. As the gain decreases, the impedance of the shunt element 902 decreases, thereby increasing the feedback, lowering the circuit's gain, and improving the circuit's linearity. The amount of feedback, known as the feedback factor (fb), is given by the following expression $$fb = \frac{Z_s \| Z_{in}}{(Z_s \| Z_{in}) + Z_{fb}}$$

where $Z_{fb}$ is the feedback impedance, $Z_s$ is the source driving impedance (typically 50Ω), and $Z_{in}$ is the input impedance to the LNA.

The feedback element 902 can be implemented using the variable capacitance of a varactor. This approach, however, is limited since it requires high-performance varactor technology. Another embodiment uses a MOSFET transistor as a variable resistance. This is directly realizable in BiCMOS technologies.

It should be also noted that at lower gain settings, the desired received signal ($P_{RX}$) is much higher than the system's noise floor. As such, the input match can be degraded without sacrificing performance. In practice, this is the case, and so the input impedance (and match) of the LNA will change with the gain in all of the above circuits.

Since all radio receivers employ an LNA, one or more embodiments included in the present invention are suitable for use in any radio architecture, including heterodyne, direct conversion, low-IF, digital-IF and sub-sampled receivers.

The present invention includes an LNA with continuously variable-gain that solves the problems created by LNA with switched-gain used in conventional radio circuits. The embodiments described above are illustrative of the present invention and are not intended to limit the scope of the invention to the particular embodiments described. Accordingly, while several embodiments of the invention have been illustrated and described, it will be appreciated that various changes can be made therein without departing from the spirit or essential characteristics thereof. Accordingly, the disclosures and descriptions herein are intended to be illustrative, but not limiting, of the scope of the invention, which is set forth in the following claims.

What is claimed is:

1. A method of operating a receiver to receive an RF signal, the receiver comprises an LNA with continuously variable gain that receives the RF signal and produces an LNA output signal coupled to a VGA, the LNA and VGA have control inputs to receive control signals that set gain factors of the LNA and VGA, respectively, the method comprising steps of:
    determining that a received power level of the RF signal is varying within a first selected power range;
    maintaining the gain factor of the VGA; and
    adjusting the gain factor of the LNA so that a signal-to-noise ratio required for demodulation of the RF signal is met with a selected margin and linearity requirements of the receiver are reduced.

2. The method of claim 1, further comprising steps of:
    determining that the received power level of the RF signal is varying within a second selected power range;
    maintaining the gain factor of the LNA; and
    adjusting the gain factor of the VGA so that the signal-to-noise ratio required for demodulation of the RF signal is met.

3. A method of operating a receiver to receive a RF signal, the receiver comprises an LNA with continuously variable gain that receives the RF signal and produces an LNA output signal coupled to a VGA, the LNA and VGA have control inputs to receive control signals that set gain factors of the LNA and VGA, respectively, the method comprising steps of:
    determining that a received power level of the RF signal is varying within a first selected power range;
    adjusting the gain factor of the VGA;
    adjusting the gain factor of the LNA so that a signal-to-noise ratio required for demodulation of the RF signal is met with a selected margin and linearity requirements of the receiver are reduced;
    determining that the received power level of the RF signal is varying within a second selected power range;
    maintaining the gain factor of the LNA; and
    adjusting the gain factor of the VGA so that the signal-to-noise ratio required for demodulation of the RF signal is met.

4. A radio receiver comprising:
    a continuously variable gain low noise amplifier (LNA) coupled to a subsequent variable gain amplifier (VGA);
    a demodulator to generate an automatic gain control signal indicating a power level of a desired received signal; and
    a control network coupled to receive the gain control signal to optimally set the gain of the LNA and VGA in a way that minimizes LNA gain while maintaining the required signal quality for proper demodulation, wherein the control network further comprises:

an input for receiving a received signal strength indicator (RSSI);

an input for receiving a quality indicator of the demodulated signal; and logic to perform a mapping function wherein the gain of the LNA and VGA are controlled optimally.

5. The control network of claim 4, wherein the logic to perform the mapping function operates to lower the gain of the LNA once the desired received signal power exceeds a level where interfering signals are possible until a gain range of the LNA is exhausted, at which point only the gain of the VGA is controlled.

6. The control network of claim 4, wherein the logic to perform the mapping function operates to lower the gain of the LNA and VGA together as the power of the received signal increases above a sensitivity threshold until the gain range of the LNA is exhausted, at which point only the gain of the VGA is controlled.

7. The control network of claim 4, wherein the quality indicator is one or more of a bit energy per noise spectral density ($E_b/N_o$), a bit error rate (BER), and a frame erasure rate (FER).

* * * * *